United States Patent [19]
Hong et al.

[11] Patent Number: 6,077,774
[45] Date of Patent: Jun. 20, 2000

[54] METHOD OF FORMING ULTRA-THIN AND CONFORMAL DIFFUSION BARRIERS ENCAPSULATING COPPER

[75] Inventors: Qi-Zhong Hong; Wei-Yung Hsu, both of Dallas, Tex.

[73] Assignee: Texas Instruments Incorporated, Dallas, Tex.

[21] Appl. No.: 08/820,744

[22] Filed: Mar. 19, 1997

[51] Int. Cl.[7] .................. H01L 21/283; H01L 21/285; H01L 21/3205; H01L 21/441
[52] U.S. Cl. .................. 438/643; 438/644; 438/645; 438/648; 438/687; 257/751; 257/752; 257/753; 257/762; 257/763; 257/767
[58] Field of Search .................. 438/762, 765, 438/769, 627, 643, 642; 427/255, 195, 435, 120, 126.3, 126.4, 126.5, 126.6, 249, 122, 130

[56] References Cited

U.S. PATENT DOCUMENTS

| | | | |
|---|---|---|---|
| 4,884,123 | 11/1989 | Dixit et al. | 357/71 |
| 5,308,793 | 5/1994 | Taguchi et al. | 437/194 |
| 5,354,712 | 10/1994 | Ho et al. | 437/195 |
| 5,430,328 | 7/1995 | Hsue | 257/750 |
| 5,492,725 | 2/1996 | Gordon | 427/248 |
| 5,502,334 | 3/1996 | Shinohara | 257/751 |

*Primary Examiner*—Tom Thomas
*Assistant Examiner*—Bernard E. Souw
*Attorney, Agent, or Firm*—Jacqueline J. Garner; Wade James Brady, III; Richard L. Donaldson

[57] ABSTRACT

A method is provided for forming thin diffusion barriers in a semiconductor device (10). In one embodiment of the invention, a metal precursor gas is introduced to a surface of a dielectric layer. A predetermined amount of heat is then applied to the metal precursor gas and the dielectric layer. The heat causes the metal precursor gas to react with the dielectric layer, thereby forming a uniform, relatively thin diffusion barrier on the surface of the dielectric layer. In another embodiment of the invention, a metal precursor gas is introduced to a surface of a metal conductor. A predetermined amount of heat can then be applied to the metal precursor gas and the metal conductor, which creates a reaction between the gas and the conductor, and thereby produces a thin diffusion barrier on the surface of the metal conductor.

20 Claims, 1 Drawing Sheet

METHOD OF FORMING ULTRA-THIN AND CONFORMAL DIFFUSION BARRIERS ENCAPSULATING COPPER

TECHNICAL FIELD OF THE INVENTION

This invention relates generally to the fabrication of integrated circuits, and more particularly to a method of forming ultra-thin and conformal diffusion barriers encapsulating copper in a semiconductor integrated circuit device.

BACKGROUND OF THE INVENTION

Because copper atoms diffuse rapidly into other materials, such as dielectric materials, conductors made of copper or copper alloy in a semiconductor device are surrounded with diffusion barriers. Prior diffusion barriers were formed by etching trenches or vias in a dielectric layer, and then sputtering, evaporating, or chemical vapor depositing a metallic diffusion barrier material onto the surfaces of the layer. Sputtering and evaporating techniques, however, did not produce diffusion barriers which conformed to the surfaces of the dielectric layer. The nonconformal coverage created "weak points" in the diffusion barriers at the bottom edges of the trenches or vias where copper atoms could diffuse through into the dielectric layer. Although chemical vapor deposition provided conformal coverage over the dielectric layer, the metallic diffusion barriers produced by this technique included many grain boundaries which could act as rapid diffusion paths for copper atoms. Consequently, metallic diffusion barriers deposited by chemical vapor deposition became increasingly unreliable at thin thicknesses. Furthermore, ultra-thin (i.e., less than 10 nm) diffusion barriers, which are required for deep submicron low-resistance copper interconnects, were difficult to produce in a controllable manner by any of the above-described techniques.

SUMMARY OF THE INVENTION

Accordingly, a need has arisen for a method of forming relatively thin, yet reliable and conformal diffusion barriers between a copper conductor and the surrounding layers of a semiconductor device.

In one embodiment of the invention, a method is provided for forming a relatively thin diffusion barrier on the surface of a dielectric layer in a semiconductor device. Initially, a metal precursor gas is introduced to the surface of the dielectric layer. A predetermined amount of heat is then applied to the metal precursor gas and the dielectric layer. The heat causes the metal precursor gas to react with the dielectric layer so that the relatively thin diffusion barrier is formed on the surface of the dielectric layer.

In a different embodiment of the invention, a second method is provided for forming a relatively thin diffusion barrier on the surface of a metal conductor in a semiconductor device. A metal precursor gas is introduced to the surface of the metal conductor. A predetermined amount of heat is applied to the metal precursor gas and the metal conductor, which results in selective deposition of a thin metal layer on top of the metal conductor. The thin metal layer reacts with a subsequently deposited dielectric layer to form a thin diffusion barrier.

An important technical advantage of the present invention is that diffusion barriers are formed that conform to the sidewall surfaces of a trench or via.

Another important technical advantage of the present invention is the formation of diffusion barriers from metal oxides and metal carbides. Because metal oxides and metal carbides prevent the diffusion of atoms more effectively than prior metallic films, these metal oxide/carbide diffusion barriers do not need to be as thick as prior diffusion barriers.

Yet another important technical advantage of the present invention is that the thickness of the diffusion barriers is self-limiting at a fixed reaction temperature. Consequently, precise regulation of the reaction time to control the thickness of the diffusion barriers is not necessary.

Yet another important technical advantage of the present invention is the formation of relatively thin diffusion barriers in a trench or via. Consequently, because a metal conductor subsequently formed in the trench or via can occupy a higher percentage of the cross-sectional area of the trench or via, the metal conductor is capable of carrying more current.

Yet another important technical advantage of the present invention is the self-alignment of the barriers to selected surfaces during formation. Thus, extra steps of processing are not required to remove diffusion barrier material from other surfaces.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiments of the present invention and its advantages are best understood by referring to FIGS. 1A–1F of the drawings, like numerals being used for like and corresponding parts of the various drawings.

In accordance with the preferred embodiments of the present invention, a method is provided for forming relatively thin diffusion barriers between a metal conductor, in a semiconductor device, and any surrounding layers, such as for example, a layer of dielectric material. The diffusion barriers thus formed have a uniform thickness. In one embodiment of the invention, a metal precursor gas is introduced to a dielectric material. The metal precursor gas and the dielectric material are then heated to decompose the metal precursor and to cause the decomposed metal atoms to react with any exposed surface of the dielectric material, thereby forming a diffusion barrier at the surface of the dielectric material. In another embodiment of the invention, a metal precursor gas is introduced to a metal conductor. Heat is applied to cause the metal precursor gas to decompose on any exposed surface of the metal conductor, thereby selectively forming a thin metal layer on the metal conductor. The thin metal layer reacts with a subsequently deposited dielectric layer to form a diffusion barrier.

Figure 1A:
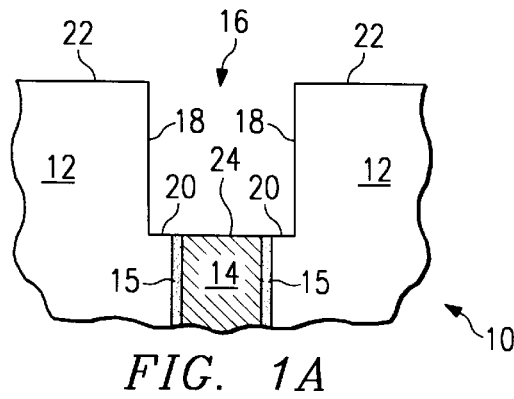
FIGS. 1A–1F are sectional views of a semiconductor device being formed in accordance with the preferred embodiments of the present invention.

FIGS. 1A–1F are sectional views of a semiconductor device 10 being formed in accordance with the preferred embodiments of the present invention. Referring to FIG. 1A, semiconductor device 10 includes a first dielectric layer 12, a first metal conductor 14, and a first diffusion barrier 15.

First dielectric layer 12 may be formed of any dielectric material having a low dielectric constant, such as silicon dioxide ($SiO_2$), plasma-enhanced tetraethyl orthosilicate (PETEOS), borophosphosilicate glass (BPSG), low-k spin-on glass (SOG), or polymer. A trench 16 is formed within first dielectric layer 12. First dielectric layer 12 can have a plurality of exposed surfaces, including at least one sidewall dielectric surface 18, at least one bottom dielectric surface 20, and at least one top dielectric surface 22.

First metal conductor 14 is arranged within first dielectric layer 12 at the bottom of trench 16. For illustrative purposes, first metal conductor 14 is shown in FIG. 1 as a metal contact; however, it must be understood that, alternatively, metal conductor 14 could be a part of a metallization layer. First metal conductor 14 may be formed from any of a variety of metals or metal alloys, such as copper (Cu), aluminum (Al), tungsten (W), and titanium nitride (TiN). First metal conductor 14 has a top metal surface 24, which is exposed at the bottom of trench 16.

First diffusion barrier 15 is disposed between first metal conductor 14 and first dielectric layer 12. First diffusion barrier 15 can be formed from a metal oxide and/or metal carbide material, such as aluminum oxide ($Al_2O_3$), titanium oxide ($TiO_2$), chromium oxide ($Cr_2O_3$), aluminum carbide (AlC), titanium carbide (TiC), and chromium carbide (CrC). First diffusion barrier 15 functions to prevent individual metal atoms in first metal conductor 14 from diffusing into first dielectric layer 12.

First metal conductor 14 and first diffusion barrier 15 can be formed in first dielectric layer 12 by the method described herein with reference to FIGS. 1A–1D.

According to a preferred method of forming the present invention, a metal precursor gas is brought into contact with device 10 illustrated in FIG. 1, for example, by placing device 10 in a deposition chamber and filling the chamber with the gas. Preferably, the metal precursor gas is a gas composed of any of a variety of metals or metallic alloys, such as aluminum, titanium, or chromium. For example, the metal precursor gas may be dimethyl-aluminum hydride (($CH_3)_2AlH$), aluminum hydride ($AlH_4$), or tetrakis dimethylamino titanium ($Ti[(CH_3)_2N]_4$).

The metal precursor gas is thereby uniformly distributed around device 10 so that the gas evenly contacts all of the exposed surfaces of the device, including those surfaces within trench 16 (i.e., sidewall dielectric surfaces 18, bottom dielectric surfaces 20, and top metal surface 24).

A predetermined amount of heat can be applied to the metal precursor gas and device 10. Preferably, the heating process may be an isothermal or rapid thermal treatment (RPT) process or furnace annealing process in the 300–450° C. range, for a period which applies heat up to 120 seconds long. Heat can be applied by any of a variety of devices/systems, such as, for example, a resistive heater or lamp heater.

The applied heat causes the metal precursor gas to react with the exposed surfaces of first dielectric layer 12. In particular, at any point where the metal precursor gas comes into contact with first dielectric layer 12, the metal atoms or metallic alloys' atoms in the metal precursor gas combine with the oxygen or carbon atoms in first dielectric layer 12. The reaction caused by heating the metal precursor gas and first dielectric layer 12 is "self-limiting." In other words, after a certain period of time, the metal precursor gas and first dielectric layer 12 cease to react with one another despite any continued application of heat.

Figure 1B:
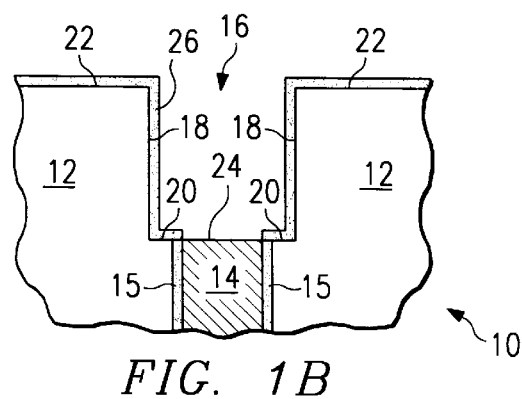

Consequently, as shown in FIG. 1B, a second diffusion barrier 26 is formed on sidewall dielectric surfaces 18, bottom dielectric surfaces 20, and top dielectric surfaces 22 as a result of the reaction of the metal precursor gas with first dielectric layer 12. Because the metal precursor gas is capable of penetrating deeply into trench 16, second diffusion barrier 26 conforms substantially to the surfaces of device 10. Furthermore, because of the self-limiting nature of the reaction, second diffusion barrier 26 has a thin thickness (e.g., approximately less than or equal to 10 nm for this embodiment). In other words, when the precursor gas and first dielectric layer 12 initially react with one another, the thickness of second diffusion barrier 26 that is formed is proportionate to the length of time the heat is applied. However, after a certain period has elapsed, the thickness of the diffusion barrier is not further increased by the continued application of heat. The resulting thickness of the diffusion barrier can be less than 10 nm, which is relatively small compared to the thickness of previous diffusion barriers. Second diffusion barrier 26 can have a metallic carbide and/or metallic oxide composition. For example, second diffusion barrier 26 may be composed of $Al_2O_3$, $Cr_2O_3$, $TiO_2$, AlC, TiC, and/or CrC.

Using the preferred temperature range of 300–450° C., the decomposed metal atoms react with first metal conductor 14 to form good electrical contact. No diffusion barrier is formed on top metal surface 24. Therefore, the reaction of the metal precursor gas with device 10 may be considered a self-aligning process in the sense that a diffusion barrier is formed on the surfaces of first dielectric layer 12, but not on the surface of first metal conductor 14.

A metal seed layer (not explicitly shown) may be formed on device 10, for example, by chemical vapor depositing a metal seed layer material on the surfaces of device 10. The metal seed layer provides continuous electrical connection between first metal conductor 14 and any metal layer subsequently formed in trench 16. The metal seed layer can be composed of any metal or metallic compound, such as Cu, TiN, or titanium tungsten (TiW), which provides nucleation sites for any subsequently formed metal layer.

Figure 1C:
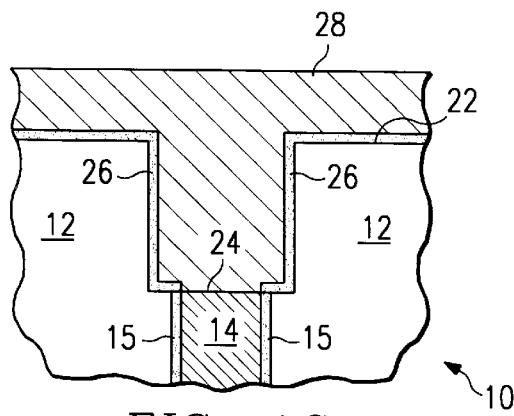

As shown in FIG. 1C, a metal layer 28 can then be formed on device 10 by any one of a variety of processes, such as chemical vapor deposition, sputtering, electroplating, or electroless plating. Metal layer 28 is composed of Cu or Cu alloy. A portion of metal layer 28 occupies trench 16. At top metal surface 24, metal layer 28 is electrically connected to first metal conductor 14. At the other points of contact between metal layer 28 and device 10, metal layer 28 is separated from first dielectric layer 12 by second diffusion barrier 26. Consequently, the individual atoms in metal layer 28 will not diffuse into first dielectric layer 12 at any of the sidewall dielectric surfaces 18, bottom dielectric surfaces 20, or top dielectric surfaces 22.

Figure 1D:
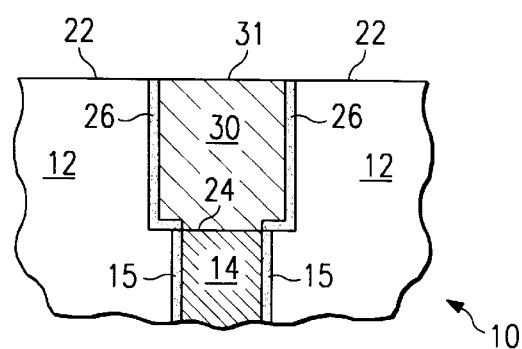

As shown in FIG. 1D, the portions of metal layer 28 and second diffusion barrier 26 extending above the plane defined by top dielectric surfaces 22 are then removed, for example, by a chemical mechanical polishing (CMP) process. Consequently, a second metal conductor 30 is thereby formed in trench 16. Because second diffusion barrier 26 is relatively thin, second metal conductor 30 occupies most of the cross-sectional area of trench 16. Therefore, the current-carrying capacity of metal conductor 30 is greater than that of previously formed metal conductors.

Figure 1E:
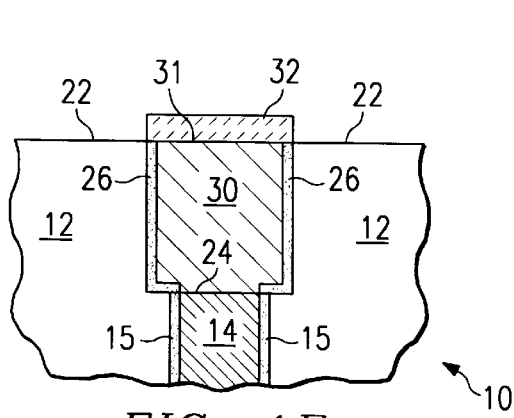

Because portions of first dielectric layer 12 and second metal conductor 30 are exposed, device 10 has a planarized surface composed of top dielectric surfaces 22 and a top metal surface 31. At this step in the preferred method, a metal precursor gas may be introduced into contact with the exposed surfaces of device 10. The metal precursor gas may be any one of the gases previously described, including $(CH_3)_2AlH$, $AlH_4$, or $Ti[(CH_3)_2N]_4$. Conditions are selected, such as, for example, low substrate temperature (e.g., 50–300° C.) and passivation of the dielectric surface, so that a metal layer is not deposited on top dielectric surface 22. Consequently, as shown in FIG. 1E, in accordance with the present invention, a self-aligning, selective gas treated layer 32 is thus formed over second metal conductor 30.

Figure 1F:
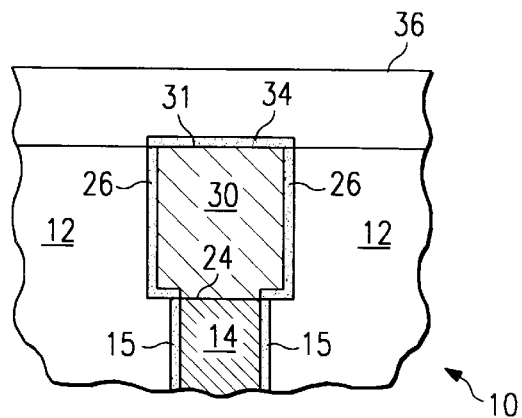

FIG. 1F shows a third diffusion barrier 34 formed over top metal surface 30, and a second dielectric layer 36 formed over the third diffusion barrier 34 and first dielectric layer 12. Second dielectric layer 36 may be deposited over device 10 by any one of a variety of processes, including a radio frequency (RF) sputtering, chemical vapor deposition, plasma-enhanced chemical vapor deposition, or spin-on glass deposition process. Second dielectric layer 36 can be formed from the same material from which first dielectric layer 12 is formed, including, for example, $SiO_2$, PETEOS, BPSG, low-k SOG, or polymer materials.

In this preferred embodiment of the present invention, the deposition of second dielectric layer 36 occurs at a temperature that is high enough to cause the metals or metal alloys in selective gas treated layer 32 (FIG. 1E) to react with oxygen and/or carbon in second dielectric layer 36 to form third diffusion barrier 34. In a second embodiment of the present invention, the deposition of dielectric material can be followed by an annealing process wherein device 10 is heated. The heat applied during the annealing process causes the third diffusion barrier 34 to form.

Third diffusion barrier 34 may be composed of a layer of metallic oxide and/or metallic carbide, such as, for example, a layer of $Al_2O_3$, $Cr_2O_3$, $TiO_2$, AlC, TiC, or CrC. Third diffusion barrier 34 preferably has a thickness of approximately less than or equal to 10 nm. In accordance with the present invention, second diffusion barrier 26 and third diffusion barrier 34 can be formed around metal conductor 30 to prevent individual metal atoms from diffusing out of metal conductor 30 into the surrounding dielectric layers.

Although the present invention and its advantages have been described in detail, it should be understood that various changes, substitutions, and alterations can be made herein without departing from the spirit and scope of the invention as defined by the appended claims.

What is claimed is:

1. A method of forming a diffusion barrier in a semiconductor device, comprising the steps of:
    flowing a metal precursor gas onto a surface of a dielectric layer of material; and
    heating said metal precursor gas and said dielectric to a predetermined temperature, to react a plurality of metal atoms from said metal precursor gas with said dielectric to form the diffusion barrier comprising a material selected from the group consisting of metallic oxides, metallic carbides, and combinations thereof on said surface of said dielectric layer.

2. The method of claim 1, wherein said metal precursor gas comprises a precursor gas selected from the group consisting of an aluminum, titanium, chromium, or other refractory metal precursor gas.

3. The method of claim 1, wherein said heating step further comprises the step of heating said metal precursor gas and said dielectric layer to a predetermined temperature in a range between 300–450° C.

4. The method of claim 1, further comprising the step of depositing a metal layer of material over said diffusion barrier.

5. The method of claim 4, wherein said metal layer comprises a layer of copper or copper alloy.

6. The method of claim 4, wherein said depositing step further comprises depositing a metal layer by a chemical vapor deposition, sputtering, electroplating, or electroless plating process.

7. The method of claim 1, wherein said heating step further comprises heating by a furnace annealing process or a rapid thermal treatment process.

8. The method of claim 1, wherein said heating step further comprises heating said metal precursor gas and said dielectric layer for a period of up to 120 seconds.

9. The method of claim 1, wherein said flowing step further comprises the steps of:
    disposing said semiconductor device in a deposition chamber; and
    filling the deposition chamber with said metal precursor gas.

10. A method of forming a diffusion barrier in a semiconductor device, comprising the steps of:
    flowing a metal precursor gas onto a surface of a metal conductor;
    heating said metal precursor gas and said metal conductor to a predetermined temperature to form a metal layer of said surface of said metal conductor; and
    transforming said metal layer into a diffusion barrier by reacting said metal layer with a dielectric layer comprising a material selected from the group consisting of oxides, carbides, and combinations thereof.

11. The method of claim 10, wherein said metal precursor gas comprises a precursor gas selected from the group consisting of an aluminum, titanium, chromium, and other refractory metal precursor gases.

12. The method of claim 10, wherein said transforming step further comprises forming a dielectric layer over said surface of said metal conductor.

13. The method of claim 10, wherein said transforming step further comprises depositing a layer of silicon dioxide, plasma-enhanced tetraethyl orthosilicate, borophosphosilicate glass, low-k spin-on glass, or polymer over said surface of said metal conductor.

14. The method of claim 10, wherein said transforming step further comprises annealing said metal precursor gas and said metal conductor at a predetermined temperature in a range between 200–450° C.

15. A method of forming diffusion barrier around a metal conductor in a semiconductor device, comprising the steps of:
    flowing a first metal precursor gas onto a first dielectric layer of a substrate of material, wherein said first dielectric layer comprises a material selected from the group consisting of oxides, carbides and combinations thereof;
    heating said first metal precursor and said first dielectric layer to a first temperature, to form a first diffusion barrier on a surface of said first dielectric layer;
    forming the metal conductor on said substrate;
    flowing a second metal precursor gas onto a surface of the metal conductor to form a metal layer on said metal conductor; and
    heating said metal layer to a second temperature, to form a second diffusion barrier on said surface of the metal conductor by reacting said metal layer with a material selected from the group consisting of oxides and carbides to form a second diffusion barrier.

16. The method of claim 15, further comprising the step of depositing a second dielectric layer over said second diffusion barrier.

17. The method of claim 15, wherein said step of forming the metal conductor comprises the steps of:
    depositing a metal layer on said substrate; and
    removing a portion of said metal layer.

18. The method of claim 15, wherein the heating to a first temperature step further comprises annealing said first metal precursor gas at a temperature in a range between 300–450° C.

19. The method of claim 15, wherein the heating to a second temperature step further comprises the step of forming a second dielectric layer on said substrate.

20. The method of claim 15, wherein the heating to a second temperature step further comprises annealing at a temperature in a range between 50–300° C.

* * * * *

UNITED STATES PATENT AND TRADEMARK OFFICE
CERTIFICATE OF CORRECTION

PATENT NO: 6,077,774
DATED: June 20, 2000
INVENTOR(S): Qi-Zhong Hong and Wei-Yung Hsu It is certified that error appears in the above-identified patent and that said Letters Patent are hereby corrected as shown below:

On title page, please insert the following after "Related U.S. Applications Data":

Provisional Application No. 60/014,614 filed 03/29/96.

Signed and Sealed this

Third Day of April, 2001

*Attest:*

NICHOLAS P. GODICI

*Attesting Officer*   *Acting Director of the United States Patent and Trademark Office*